(12) United States Patent
Lee

(10) Patent No.: US 11,715,626 B2
(45) Date of Patent: Aug. 1, 2023

(54) SYSTEM AND METHOD FOR CLEANING SURFACE OF SUBSTRATE USING ROLL-TO-ROLL PLASMA GENERATING DEVICE

(71) Applicant: Chang Hoon Lee, Seoul (KR)

(72) Inventor: Chang Hoon Lee, Seoul (KR)

( * ) Notice: Subject to any disclaimer, the term of this patent is extended or adjusted under 35 U.S.C. 154(b) by 315 days.

(21) Appl. No.: 17/150,826

(22) Filed: Jan. 15, 2021

(65) Prior Publication Data

US 2022/0020562 A1 Jan. 20, 2022

(30) Foreign Application Priority Data

Jul. 14, 2020 (KR) .......................... 10-2020-0086855

(51) Int. Cl.
*H01J 37/32* (2006.01)

(52) U.S. Cl.
CPC .... *H01J 37/3244* (2013.01); *H01J 37/32522* (2013.01); *H01J 37/32899* (2013.01)

(58) Field of Classification Search
CPC .... H01J 37/32; H01J 37/3244; H01J 37/3277; H01J 37/32522; H01J 37/32899; H01J 2237/335; B08B 5/00; B08B 5/02; B08B 7/00; B08B 7/0092; B08B 2205/00
See application file for complete search history.

(56) References Cited

U.S. PATENT DOCUMENTS

| 7,635,016 B2 * | 12/2009 | Suzuki | H05K 3/26 438/719 |
| 2004/0026385 A1 * | 2/2004 | Koulik | C23C 16/402 219/121.36 |
| 2017/0098540 A1 * | 4/2017 | Xie | B08B 9/027 |
| 2019/0261500 A1 * | 8/2019 | Suzuki | B29C 59/14 |

FOREIGN PATENT DOCUMENTS

| KR | 10-1996-0026322 A | 7/1996 |
| KR | 10-1158334 B1 | 6/2012 |

* cited by examiner

*Primary Examiner* — Thai Pham
(74) *Attorney, Agent, or Firm* — Nath, Goldberg & Meyer; Jerald L. Meyer

(57) ABSTRACT

A roll-to-roll surface cleaning treatment system may include an upper housing containing a first plasma generating device and a first transfer roller that faces a nozzle from which a plasma beam generated by the first plasma generating device is discharged and that winds and transfers a flexible substrate, the upper housing comprising a gas inlet, an entrance through which the flexible substrate is introduced, and an outlet through which the flexible substrate is discharged, and a lower housing connected to the entrance of the upper housing and containing a second plasma generating device and a second transfer roller that faces a nozzle from which a plasma beam generated by the second plasma generating device is discharged and that winds and transfers the flexible substrate, the lower housing comprising a gas outlet, and an inlet through which the flexible substrate is introduced.

4 Claims, 5 Drawing Sheets

SYSTEM AND METHOD FOR CLEANING SURFACE OF SUBSTRATE USING ROLL-TO-ROLL PLASMA GENERATING DEVICE

CROSS-REFERENCE TO RELATED APPLICATIONS

This application claims priority from Korean Patent Application No. 10-2020-0086855, filed on Jul. 14, 2020 in the Korean Intellectual Property Office, the disclosure of which is incorporated herein by reference in its entirety.

TECHNICAL FIELD

The present disclosure relates to a system and method for cleaning a surface of a substrate using a roll-to-roll plasma generating device, and more particularly, to a system and method capable of cleaning a surface of a large-scale flexible substrate using a roll-to-roll plasma generating device including a plurality of plasma heads.

BACKGROUND ART

In general, a method utilizing a roll-to-roll surface treatment device is widely used for treating or cleaning a surface of a web substrate or a flexible substrate (e.g., metal substrate). The roll-to-roll device includes an unwinding roller for unwinding a substrate that is a subject to be treated and a winding roller for winding and pulling the flexible substrate, and uses the winding roller to supply the substrate to a surface treatment area (e.g., vacuum chamber or wet cleaning area) to perform surface treatment of the substrate. In particular, in the roll-to-roll metal surface cleaning device for surface treatment of a metal substrate, in most cases, wet cleaning is performed to remove organic substances from the surface of the substrate. Meanwhile, the wet cleaning is a cleaning operation that uses, for example, cleaning chemicals and/or distilled water to remove organic substances, and this requires a considerably high maintenance cost, takes a long time to clean, and causes additional problems due to contaminants generated after cleaning.

Meanwhile, the "plasma" refers to a collection of particles comprised of ion nuclei and free electrons that are generated when the temperature is increased by continuously applying heat to a gaseous substance. This state of matter is called the "plasma state", and is called the fourth state of matter, in addition to the states of matter of solid, liquid and gas. The plasma state is electrically neutral, and when used as a coating on a surface of a material, it is possible to prevent abrasion or corrosion, thereby enhancing the state of the material. In addition, the plasma may also be used for cleaning purposes, such as removing organic substances or oxide films attached to the surface of the material.

In addition, the related roll-to-roll plasma surface treatment device for surface treatment of a flexible substrate includes a cylindrical drum (or transfer roller) on a surface of which the substrate is in close contact and the substrate in close contact is subjected to plasma treatment, and at least one plasma generating device disposed to face the drum. In the related roll-to-roll plasma surface treatment device, heat of plasma radiated to the flexible substrate may be transferred to the drum through the flexible substrate, and the heat transferred to the drum may cause deteriorating quality of the substrate. In addition, when the substrate is tilted to the left or right, this may cause a phenomenon in which the flexible substrate bulges from the drum, and temperature deviations are generated in the flexible substrate during surface treatment of the substrate, resulting in a problem of deteriorating quality. In addition, when it is necessary to treat the flexible substrate with different plasma surface treatment processes, there is inconvenience of having to perform individual treatments using the roll-to-roll plasma surface treatment devices suitable for each of the surface treatment processes.

SUMMARY

The present disclosure provides a system and method capable of removing organic substances through environmentally friendly dry cleaning using plasma, instead of the wet cleaning of the related roll-to-roll metal surface treatment device as described above.

In addition, the present disclosure provides a system and method capable of solving problems such as overheating of a transfer roller due to plasma heat and subsequent damage to the flexible substrate, and temperature deviations occurring during movement of the flexible substrate by the transfer roller in the related roll-to-roll plasma surface cleaning device, and efficiently performing a plurality of surface cleaning processes having different characteristics by using an atmospheric pressure plasma generating device including a plurality of plasma heads.

A roll-to-roll plasma surface cleaning treatment system according to an embodiment of the present disclosure is provided, which may include an upper housing containing a first plasma generating device and a first transfer roller that faces a nozzle from which a plasma beam generated by the first plasma generating device is discharged and that winds and transfers a flexible substrate, the upper housing comprising a gas inlet, an entrance through which the flexible substrate is introduced, and an outlet through which the flexible substrate is discharged, and a lower housing connected to the entrance of the upper housing and containing a second plasma generating device and a second transfer roller that faces a nozzle from which a plasma beam generated by the second plasma generating device is discharged and that winds and transfers the flexible substrate, the lower housing comprising a gas outlet, and an inlet through which the flexible substrate is introduced, in which the upper housing may be maintained at a low-temperature atmosphere by introducing a low-temperature refrigerant gas through the gas inlet.

According to an embodiment, the first plasma generating device 210 may generate the plasma beam by discharging a foaming gas containing nitrogen $N_2$ and hydrogen $H_2$ to remove an oxide film formed on a surface of the flexible substrate.

According to an embodiment, the second plasma generating device may generate the plasma beam by discharging a forming gas containing compressed air to remove organic substances formed on the surface of the flexible substrate, and the gas outlet may discharge foreign matter containing organic substances removed by the second plasma generating device.

According to an embodiment, the system may further include a water cooling pipe extending through a central portion of the first transfer roller and the second transfer roller; and a cooler that adjusts the temperature of the cooling water flowing through the water cooling pipe, and the cooler may include a cooling unit that adjusts the temperature of the cooling water flowing through the cooler, and a supply unit that supplies the cooling water of which temperature is adjusted by the cooling unit to the transfer rollers through the water cooling pipe.

A roll-to-roll plasma surface cleaning treatment method according to an exemplary embodiment is provided, which may include transferring a flexible substrate into a lower housing by a second transfer roller, removing organic substances formed on a surface of the flexible substrate by a second plasma generating device facing the second transfer roller, transferring the flexible substrate into an upper housing by a first transfer roller, and removing an oxide film formed on the surface of the flexible substrate by a first plasma generating device facing the first transfer roller.

According to various embodiments of the present disclosure, organic substances and an oxide film on a large-scale flexible substrate can be effectively cleaned by using the atmospheric pressure plasma generating device including a plurality of plasma heads.

According to various embodiments of the present disclosure, it is possible to remove an organic film on a large-scale flexible substrate in a substantially independent organic film cleaning space by using the atmospheric pressure plasma generating device including a plurality of plasma heads, and then remove an oxide film formed on the surface of the substrate effectively in a substantially independent oxide film cleaning space by way of discharge of foaming gas containing nitrogen $N_2$ and hydrogen $H_2$ by using the atmospheric pressure plasma generating device including a plurality of separate plasma heads.

According to various embodiments of the present disclosure, by using the atmospheric pressure plasma generating device, cleaning of the large-scale flexible substrate can be efficiently performed in an environmentally friendly dry cleaning method.

According to various embodiments of the present disclosure, in a roll-to-roll plasma surface cleaning treatment system and method, by installing a water cooling pipe extending through the inside of the transfer rollers arranged to face the plasma generating device, damages, deterioration, or deformation of the substrate due to plasma heating can be prevented in the process of performing plasma treatment on the flexible substrate that is transferred in close contact with the transfer rollers. In addition, by forecasting and adjusting the temperature change of the transfer rollers, the system can effectively adjust the temperature of the flexible substrate moved in close contact with the transfer rollers in the roll-to-roll plasma surface cleaning treatment system and method.

BRIEF DESCRIPTION OF THE DRAWINGS

Embodiments of the present disclosure will be described with reference to the accompanying drawings described below, where similar reference numerals indicate similar elements, but are not limited thereto, in which.

DETAILED DESCRIPTION OF THE INVENTION

Figure 1:
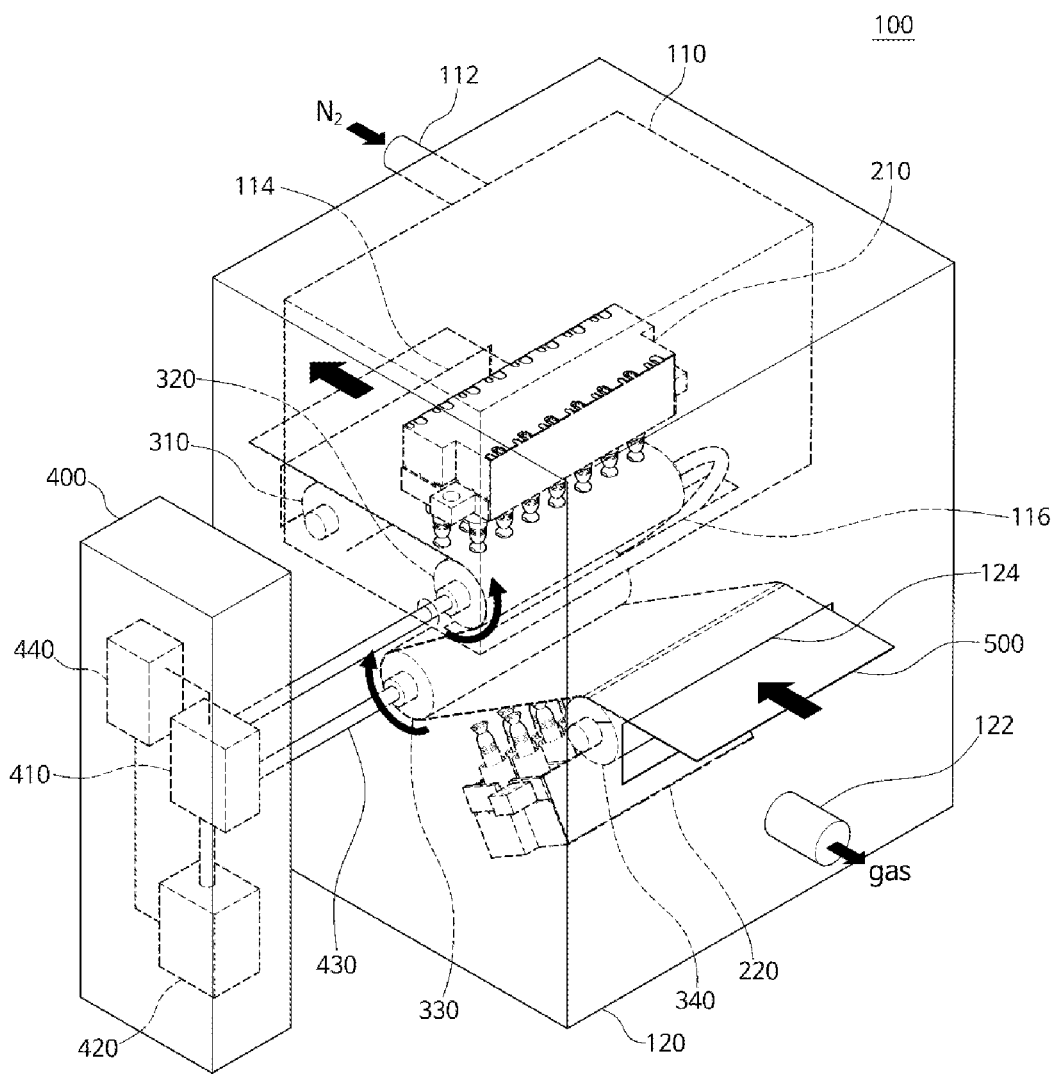
FIG. 1 is a perspective view showing a configuration of a roll-to-roll plasma surface cleaning treatment system according to an exemplary embodiment.

In the accompanying drawings, the same or corresponding elements are assigned the same reference numerals. In addition, in the following description of the embodiments, duplicate descriptions of the same or corresponding elements may be omitted. However, even if descriptions of elements are omitted, it is not intended that such elements are not included in any embodiment.

Advantages and features of the disclosed embodiments and methods of accomplishing the same will be apparent by referring to embodiments described below in connection with the accompanying drawings. However, the present disclosure is not limited to the embodiments disclosed below, and may be implemented in various different forms, and the embodiments are merely provided to make the present disclosure complete, and to fully disclose the scope of the invention to those skilled in the art to which the present disclosure pertains.

The terms used in the present disclosure will be briefly described prior to describing the disclosed embodiments in detail.

The terms used herein have been selected as general terms which are widely used at present in consideration of the functions of the present disclosure, and this may be altered according to the intent of an operator skilled in the art, conventional practice, or introduction of new technology. In addition, in a specific case, a term is arbitrarily selected by the applicant, and the meaning of the term will be described in detail in a corresponding description of the embodiments. Therefore, the terms used in the present disclosure should be defined based on the meaning of the terms and the overall contents of the present disclosure rather than a simple name of each of the terms.

As used herein, the singular forms "a," "an," and "the" are intended to include the plural forms as well, unless the context clearly indicates the singular forms. Further, the plural forms are intended to include the singular forms as well, unless the context clearly indicates the plural forms.

Further, throughout the description, when a portion is stated as "comprising (including)" an element, it intends to mean that the portion may additionally comprise (or include or have) another element, rather than excluding the same, unless specified to the contrary.

In the present disclosure, the term "part" or "portion" or "device" means a software element, a hardware element, or a combination of these, and the "part" or "portion" or "device" may be configured to perform a specific role or function. However, the meaning of the "part" or "portion" or "device" is not limited to software or hardware. The "part" or "portion" or "device" may be configured to be in an addressable storage medium or to execute one or more processors. Accordingly, as an example, the "part" or "portion" or "device" includes elements such as software elements, object-oriented software elements, class elements, and task elements, processes, functions, attributes, procedures, subroutines, program code segments, drivers, firmware, micro-codes, circuits, data, database, data structures, tables, arrays, and variables. Furthermore, elements and the "parts" or "portions" or "devices" described in the present disclosure may be combined as a smaller number of elements and "parts" or "portions" or "devices", or further divided into additional elements and "parts" or "portions" or "devices".

Figure 2:
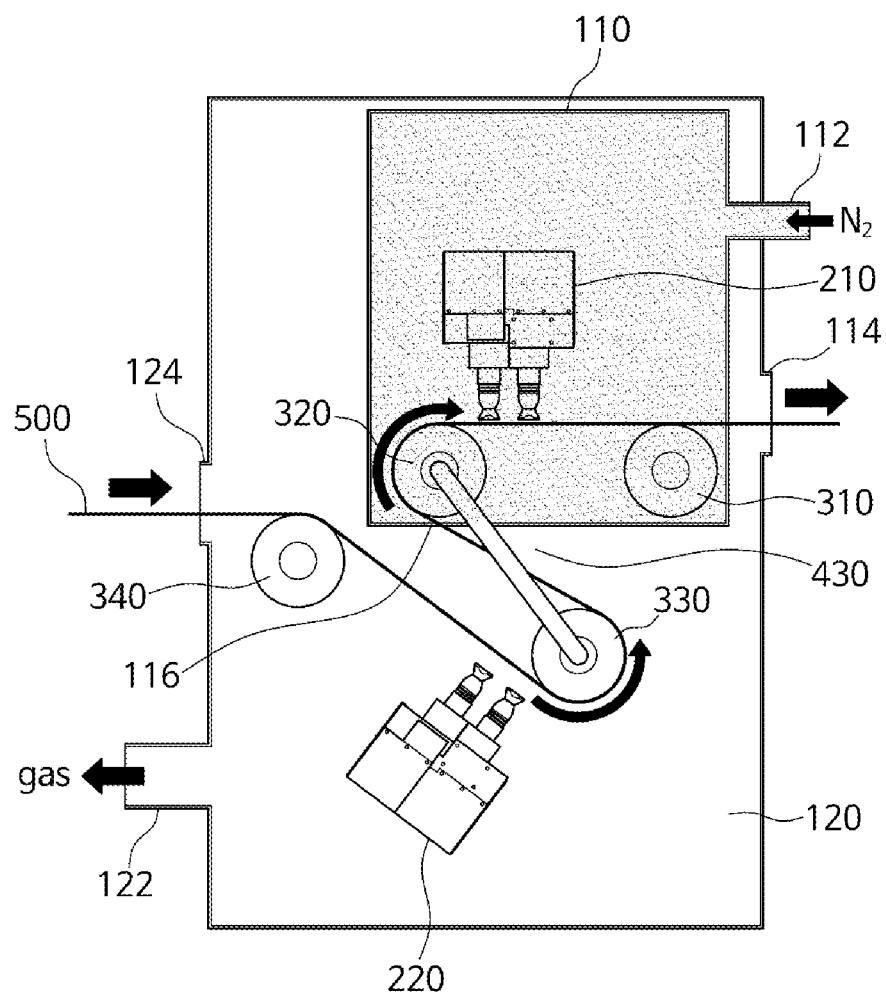
FIG. 2 is a side view showing a configuration of a roll-to-roll plasma surface cleaning treatment system according to an exemplary embodiment.

FIG. 1 is a perspective view showing a configuration of a roll-to-roll plasma surface cleaning treatment system according to an exemplary embodiment, and FIG. 2 is a side view showing the configuration of the roll-to-roll plasma surface cleaning treatment system according to an exemplary embodiment.

As shown, the roll-to-roll plasma surface cleaning treatment system 100 may include an upper housing 110 (hereinafter also referred to as an "oxide film cleaning space") containing a first plasma generating device 210, and a first transfer roller 320 that faces a nozzle from which a plasma beam generated by the first plasma generating device 210 is discharged and winds and transfers a flexible substrate 500. The upper housing 110 may include a gas inlet 112 for introducing nitrogen gas for forming the interior of the oxide film cleaning space into a low-temperature nitrogen atmosphere, an entrance 116 through which the flexible substrate 500 from which organic substances are removed is entered, and an outlet 114 through which the flexible substrate 500 from which an oxide film is removed is discharged.

In addition, the roll-to-roll plasma surface cleaning treatment system 100 may include a lower housing 120 (hereinafter also referred to as an "organic film cleaning space") connected to the entrance 116 of the upper housing 110 and containing a second plasma generating device 220 and a second transfer roller 330 that faces the nozzle from which the plasma beam generated by the second plasma generating device 220 is discharged and winds and transfers the flexible substrate 500. The lower housing 120 may include a gas outlet 122 for discharging various organic substances and processing gases generated in the process of cleaning the organic film on the surface of the flexible substrate 500 in the organic film cleaning space, and an inlet 124 through which the flexible substrate 500 is introduced.

In addition, the roll-to-roll plasma surface cleaning treatment system 100 may include a water cooling pipe 430 extending through the central portion of each of the first transfer roller 320 disposed in the oxide film cleaning space and the second transfer roller 330 disposed in the organic film cleaning space, and a cooler 400 that adjusts the temperature of the cooling water flowing through the water cooling pipe 430.

The first plasma generating device 210 installed in the oxide film cleaning space may generate the plasma beam by discharging a foaming gas containing nitrogen $N_2$ and hydrogen $H_2$ to remove the oxide film formed on the surface of the flexible substrate 500 formed of a metal material, for example. Since the oxide film cleaning process can be effectively performed in a low-temperature atmosphere, nitrogen $N_2$ gas is introduced into the oxide film cleaning space through the gas inlet 112 of the upper housing 110 to maintain the low-temperature atmosphere in the oxide film cleaning space during the plasma surface treatment by the first plasma generating device 210.

The second plasma generating device 220 installed in the organic substance cleaning space may be used for cleaning organic substances formed on the surface of the flexible substrate 500 formed of a metal material, for example. The second plasma generating device 220 may generate a plasma beam by discharging a forming gas including compressed air to remove organic substances formed on the surface of the flexible substrate 500 transferred through the inlet 124. The gas outlet 122 of the organic substance cleaning space may be configured to discharge foreign matter including the organic substances removed by the second plasma generating device 220.

The transfer roller 330 may be disposed to face the nozzle from which the plasma beam generated by the plasma generating device 220 is discharged, and wind the flexible substrate 500 transferred by the transfer roller 340 to transfer it to the direction of the transfer rollers 320 and 310. With this configuration, the surface of the flexible substrate 500 may be treated with the plasma radiated from the plasma generating devices 210 and 220 while the flexible substrate 500 is transferred in close contact with the surfaces of the transfer rollers.

The transfer rollers 320 and 330 may include the water cooling pipe 430 extending through an approximately central portion of the rollers in the central axis direction (or rotation axis). In this configuration, the cooling water is supplied through the water cooling pipe 430 so that the temperature of the transfer rollers 320 and 330 may be adjusted by the cooling water.

The cooler 400 may include a cooling unit 410 that adjusts the temperature of the cooling water flowing through the cooler, and a supply unit 420 that supplies the cooling water of which temperature is adjusted by the cooling unit 410 to the transfer rollers through the water cooling pipe 430.

The cooler 400 is configured to store the cooling water introduced through the water cooling pipe 430, adjust the temperature of the stored cooling water by the cooling unit 410, and then discharge it through the water cooling pipe 430 so that the cooling water can be circulated through the transfer rollers 320 and 330. In addition, the cooler 400 may control the temperature of the cooling water stored or circulated therein. In an embodiment, the cooler 400 may control the temperature of the cooling water based on a temperature control signal received from a controller 440.

The controller 440 may measure the intensity (or temperature) of the plasma beam through a thermal sensor (not shown) mounted on the plasma generating devices 210 and 220, and generate a temperature control signal based on the measured intensity of the plasma beam. The temperature control signal generated by the controller 440 may be provided to the cooling unit 410 such that the cooling unit 410 may control the temperature of the cooling water passed therein based on the temperature control signal.

Among the elements of the roll-to-roll plasma surface cleaning treatment system 100 shown in FIG. 2, the elements denoted by the same reference numerals as those of the system 100 shown in FIG. 1 may have the same or similar functions and configurations. Accordingly, hereinafter, detailed descriptions of the functions and configurations of the elements denoted by the same reference numerals as those of the system 100 shown in FIG. 1 will be omitted.

As shown, in the lower housing 120 of the roll-to-roll plasma surface cleaning treatment system 100, the flexible substrate 500 entered into the organic substance cleaning space through the inlet 124 is transferred in close contact with the transfer roller 340, so as to be transferred to the direction of the transfer roller 330 that is disposed to face the second plasma generating device 220. Here, the second plasma generating device 220 may generate a plasma beam by the electric discharge with the compressed air as the working gas to clean organic substances attached to the surface of the flexible substrate 500 positioned on the transfer roller 330. The mixture of the organic substances generated in the organic substance cleaning space and the working gas may be discharged to the outside through the outlet 122 formed at one side of the lower housing 120.

Meanwhile, the transfer roller 320 disposed in the upper housing 110 winds and pulls the flexible substrate 500 introduced through the entrance 116 such that the substrate is passed under the nozzle of the first plasma generating device 210 and transferred to the outlet 114 by the transfer roller 310. The first plasma generating device 210 disposed in the oxide film cleaning space may generate a plasma beam by discharging the foaming gas containing nitrogen $N_2$ and hydrogen $H_2$ to clean the oxide attached to the surface of the flexible substrate. Since the oxide film cleaning process in the oxide film cleaning space by the first plasma generating device 210 is efficiently performed in the low-temperature atmosphere, nitrogen $N_2$ gas can be continuously or intermittently introduced through the gas inlet 112.

Since the flexible substrate 500 transferred between the upper housing 110 and the lower housing 120 having the configuration described above is moved through a limited passage such as the entrance 116, the oxide film cleaning space and the organic substance cleaning space can be substantially separated. Accordingly, the oxide film cleaning space can efficiently maintain a low-temperature nitrogen atmosphere, and the organic substance cleaning space can maintain an independent atmosphere of atmospheric pressure.

Figure 3:
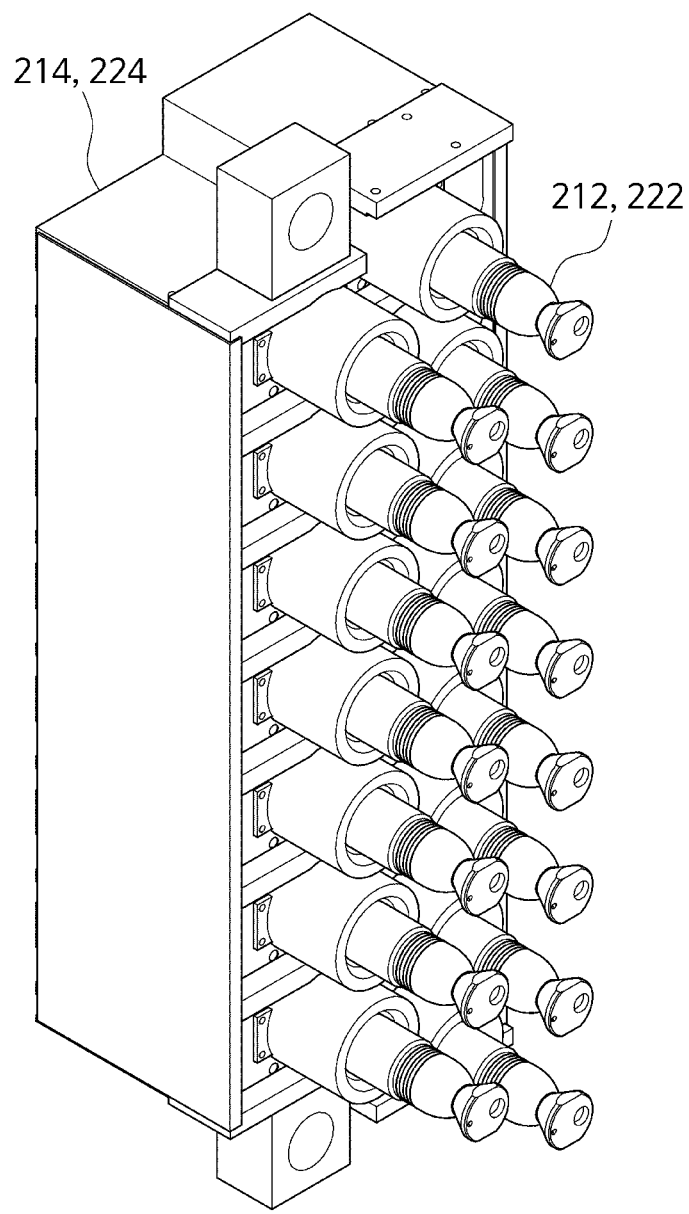
FIG. 3 is a view showing a plasma generating device including a plurality of plasma heads used in a roll-to-roll plasma surface cleaning treatment system according to an exemplary embodiment.

FIG. 3 is a view showing a plasma generating device including a plurality of plasma heads used in the roll-to-roll plasma surface cleaning treatment system according to an exemplary embodiment.

As shown, the plasma generating devices 210 and 220 installed in the roll-to-roll plasma surface cleaning treatment system 100 may include two rows of a plurality of plasma heads 212 and 222 fixed to bodies 214 and 224. By arranging a plurality of plasma heads 212 and 222 in the plasma generating devices 210 and 220 as described above, the nozzles of the plasma heads 212 and 222 may be arranged at a parallel angle to face the transfer rollers 320 and 330.

In the embodiment shown in FIG. 3, a plurality of plasma heads 212 and 222 are disposed at regular intervals in the plasma generating devices 210 and 220, but the configuration of the roll-to-roll plasma surface cleaning treatment system 100 of the present disclosure is not limited thereto. For example, a plasma head having one or more linear nozzles may be fixed to the plasma generating devices 210 and 220 and disposed to face the transfer rollers 320 and 330.

Figure 4:
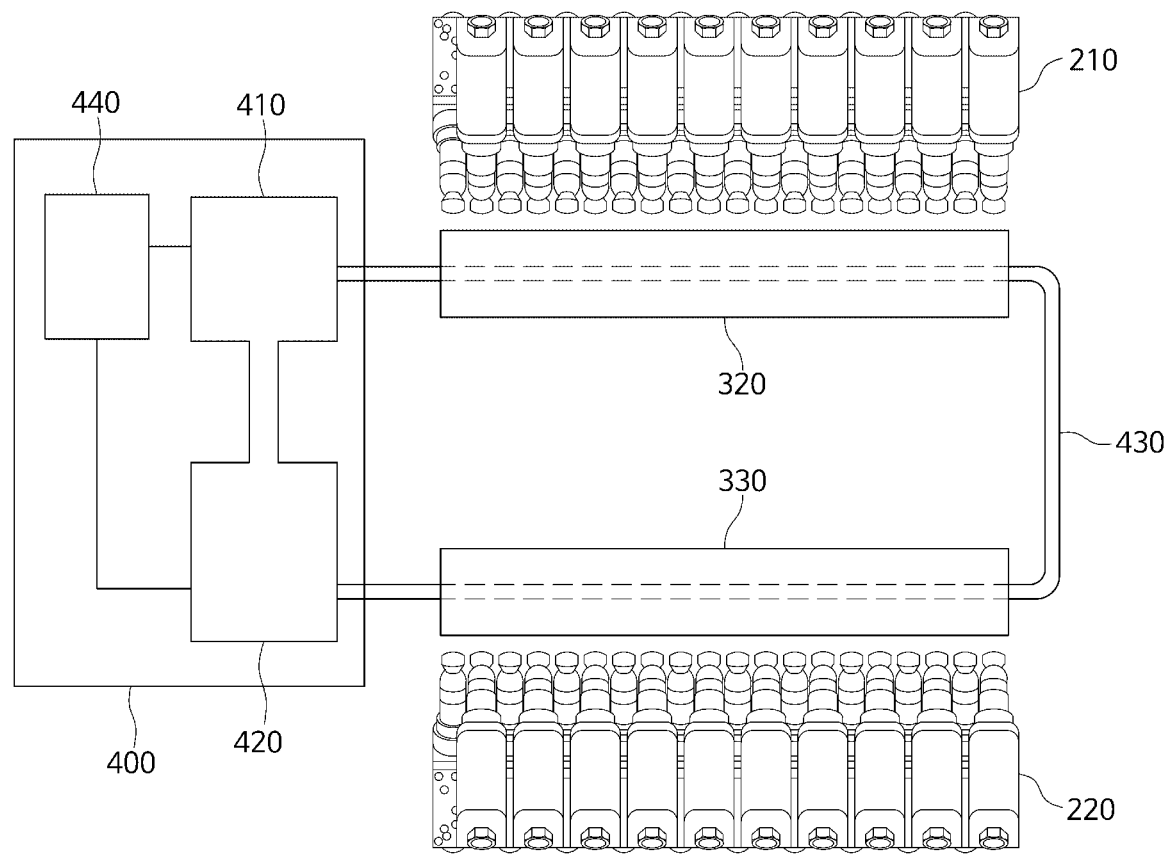
FIG. 4 is a view showing a configuration of a cooler that adjusts the temperature and controls the circulation of cooling water passed through a water cooling pipe in a roll-to-roll plasma surface cleaning treatment system according to an exemplary embodiment.

FIG. 4 is a view showing a configuration of the cooler that adjusts the temperature and controls the circulation of the cooling water passed through the water cooling pipe in the roll-to-roll plasma surface cleaning treatment system according to an exemplary embodiment.

Among the elements of the roll-to-roll plasma surface cleaning treatment system 100 shown in FIG. 4, the elements denoted by the same reference numerals as those of the system 100 shown in FIGS. 1 to 3 may have the same or similar functions and configurations. Accordingly, hereinafter, detailed descriptions of the functions and configurations of the elements denoted by the same reference numerals as those of the system 100 shown in FIGS. 1 to 3 will be omitted.

As shown, the cooler 400 includes the cooling unit 410 that adjusts the temperature of the cooling water introduced into the cooler 400 through the water cooling pipe 430, and the supply unit 420 that circulates the cooling water of which temperature is adjusted by the cooling unit 410 back to the water cooling pipe 430.

In an embodiment, the cooling unit 410 may include a cooling fan for lowering the temperature of the cooling water. In another embodiment, the cooling unit 410 may include therein a fin-shaped structure capable of increasing a specific surface area, thereby improving a cooling effect of the cooling water passed through the structure.

The supply unit 420 may circulate the cooling water of which the temperature is adjusted by the cooling unit 410 into the transfer rollers 320 and 330 through the water cooling pipe 430. For example, the supply unit 420 may include a circulation pump capable of circulating the cooling water through the water cooling pipe 430.

The cooling water passed through the water cooling pipe 430 and the cooler 400 may include water or an inert gas, but is not limited thereto, and may also include various fluids having cooling effect.

In addition, the cooler 400 may control the temperature of the cooling water stored or circulated therein. In an embodiment, the cooler 400 may control the temperature of the cooling water based on a temperature control signal received from the controller 440.

The controller 440 may measure the intensity (or temperature) of the plasma beam through a thermal sensor (not shown) mounted on the plasma generating devices 210 and 220, and generate a temperature control signal based on the measured intensity of the plasma beam. The temperature control signal generated by the controller 440 may be provided to the cooling unit 410 such that the cooling unit 410 may control the temperature of the cooling water passed therein based on the temperature control signal.

Figure 5:
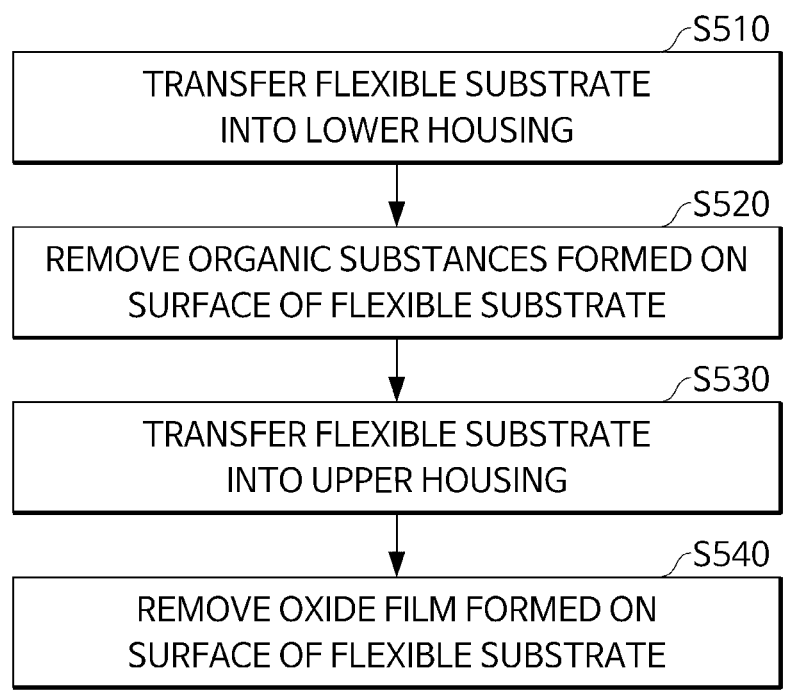
FIG. 5 is a flowchart showing a roll-to-roll plasma surface cleaning treatment method according to an exemplary embodiment.

FIG. 5 is a flowchart showing a roll-to-roll plasma surface cleaning treatment method according to an exemplary embodiment.

The roll-to-roll plasma surface cleaning treatment method may begin as the flexible substrate to be surface cleaned is introduced through the inlet 124 of the flexible substrate formed in the lower housing 120, by transferring the flexible substrate into the lower housing 120 by the transfer rollers 330 and 340, at S510. Referring to FIG. 2, in an embodiment, in the lower housing 120, the flexible substrate entered into the organic substance cleaning space through the inlet 124 is transferred in close contact with the transfer roller 340, so as to be transferred to the direction of the transfer roller 330 that is disposed to face the second plasma generating device 220.

Next, the organic substances formed on the surface of the flexible substrate may be removed by the second plasma generating device 220 facing the second transfer roller 330, at S520. Referring to FIG. 2, in an embodiment, the second plasma generating device 220 may generate a plasma beam by the electric discharge with the compressed air as the working gas to clean organic substances attached to the surface of the flexible substrate positioned on the transfer roller 330. The mixture of the organic substances and the working gas generated in the organic substance cleaning space may be discharged to the outside through the outlet 122 formed at one side of the lower housing 120.

At S530, the flexible substrate, from which the organic substances are removed by the second plasma generating device 220 installed in the organic substance cleaning space, is introduced into the oxide cleaning space through the entrance 116 of the upper housing 110 and transferred into the upper housing 110 by the first transfer roller 320, at S530. Referring to FIG. 2, in an embodiment, the transfer roller 320 disposed in the upper housing 110 winds and pulls the flexible substrate introduced through the entrance 116 such that the substrate is passed under the nozzle of the first plasma generating device 210 and transferred to the outlet 114 by the transfer roller 310.

Meanwhile, removing the oxide film formed on the surface of the flexible substrate from which organic substances are removed, is performed by the first plasma generating device 210 facing the first transfer roller 320, at S540. Referring to FIG. 2, in an embodiment, first plasma generating device 210 disposed in the oxide film cleaning space may generate a plasma beam by discharging the foaming gas containing nitrogen $N_2$ and hydrogen $H_2$ to clean the oxide attached to the surface of the flexible substrate. Since the oxide film cleaning process in the oxide film cleaning space by the first plasma generating device 210 is efficiently performed in the low-temperature atmosphere, nitrogen $N_2$ gas can be continuously or intermittently introduced through the gas inlet 112.

According to the method described above, since the flexible substrate transferred between the upper housing 110 and the lower housing 120 is moved through a limited passage such as the entrance 116, the oxide film cleaning space and the organic substance cleaning space can be substantially separated. Accordingly, the oxide film cleaning space can efficiently maintain a low-temperature nitrogen atmosphere, and the organic substance cleaning space can maintain an independent atmosphere of atmospheric pressure. Further, since the upper housing 110 and the lower housing 120 are configured to be connected to each other, a plurality of different cleaning processes can be efficiently executed.

Although the present disclosure has been described in connection with some embodiments herein, it should be understood that various modifications and changes can be made without departing from the scope of the present disclosure, which can be understood by those skilled in the art to which the present disclosure pertains. Further, such modifications and changes are intended to fall within the scope of the claims appended herein.

What is claimed is:

1. A roll-to-roll plasma surface cleaning treatment system, comprising:
    an upper housing containing a first plasma generating device and a first transfer roller that faces a nozzle from which a plasma beam generated by the first plasma generating device is discharged; winds and transfers a flexible substrate into the upper housing by a first transfer roller, the upper housing comprising a gas inlet, an entrance through which the flexible substrate is introduced, and an outlet through which the flexible substrate is discharged; and
    a lower housing connected to the entrance of the upper housing and containing a second plasma generating device and a second transfer roller that faces a nozzle from which a plasma beam generated by the second plasma generating device is discharged; winds and transfers the flexible substrate into the lower housing by the second transfer roller, the lower housing comprising a gas outlet, and an inlet through which the flexible substrate is introduced,
    wherein the system is configured to maintain the upper housing at a low-temperature atmosphere by introducing a low-temperature refrigerant gas through the gas inlet.

2. The system according to claim 1, wherein the first plasma generating device generates the plasma beam by discharging a foaming gas containing nitrogen ($N_2$) and hydrogen ($H_2$) to remove an oxide film formed on a surface of the flexible substrate.

3. The system according to claim 1, wherein the second plasma generating device generates the plasma beam by discharging a forming gas containing compressed air to remove organic substances formed on the surface of the flexible substrate, and
    the gas outlet is configured to discharge foreign matter containing the organic substances removed by the second plasma generating device.

4. The system according to claim 1, further comprising:
    a water cooling pipe extending through a central portion of the first transfer roller and the second transfer roller; and
    a cooler that adjusts a temperature of a cooling water flowing through the water cooling pipe,
    wherein the cooler includes:
        a cooling unit that adjusts temperature of the cooling water flowing through the cooler; and
        a supply unit that supplies the cooling water of which temperature is adjusted by the cooling unit to the transfer rollers through the water cooling pipe.

* * * * *